US006794978B2

(12) United States Patent
Tung et al.

(10) Patent No.: US 6,794,978 B2
(45) Date of Patent: Sep. 21, 2004

(54) ACCURATE MULTI-GROUND INDUCTORS FOR HIGH-SPEED INTEGRATED CIRCUITS

(76) Inventors: John C. Tung, 20975 Valley Green Dr., Suite 293, Cupertino, CA (US) 95014; Minghao (Mary) Zhang, 20975 Valley Green Dr., Suite 293, Cupertino, CA (US) 95014

( * ) Notice: Subject to any disclaimer, the term of this patent is extended or adjusted under 35 U.S.C. 154(b) by 0 days.

(21) Appl. No.: 10/146,854

(22) Filed: May 15, 2002

(65) Prior Publication Data

US 2003/0214378 A1 Nov. 20, 2003

(51) Int. Cl.[7] ................................................ H01F 2/00
(52) U.S. Cl. ...................................... 336/200; 257/531
(58) Field of Search ............................... 336/200, 223, 336/232; 257/531, 295, 258, 528; 333/185

(56) References Cited

U.S. PATENT DOCUMENTS

| 4,947,228 | A | * | 8/1990 | Gabara ........................ 257/369 |
| 5,760,456 | A | * | 6/1998 | Grzegorek et al. ......... 257/531 |
| 5,834,992 | A | * | 11/1998 | Kato et al. ................... 333/185 |
| 6,149,987 | A | * | 11/2000 | Perng et al. ................. 427/579 |
| 6,362,012 | B1 | * | 3/2002 | Chi et al. ..................... 438/3 |
| 6,456,183 | B1 | * | 9/2002 | Basteres et al. ............. 336/200 |
| 6,600,208 | B2 | * | 7/2003 | Brennan et al. ............. 257/531 |

FOREIGN PATENT DOCUMENTS

WO    WO 98/50956    * 11/1998

* cited by examiner

*Primary Examiner*—Chau N. Nguyen
(74) *Attorney, Agent, or Firm*—Joe Zheng

(57) ABSTRACT

A structure and method for implementing a precision inductive component within a high frequency integrated circuit is disclosed. The inductive component has a structure of multiple conductive layers dielectrically insulated from each other and located above an integrated circuit substrate. The inductive component comprises a spiral-like inductive layer made of a first conductive layer. Additionally, a number of additional ground planes, each patterned out of its own selected conductive layer to minimize an induced eddy current therein thus improving Q (quality factor) under high frequency operation, are employed with either a linear or a rotational offset amongst them to effect a corresponding amount of adjustment of an inductance value of the inductive component. A number of specific design cases are presented with their respective inductance and RF performance parameters.

22 Claims, 13 Drawing Sheets

Fig. 2A CASE-Ref
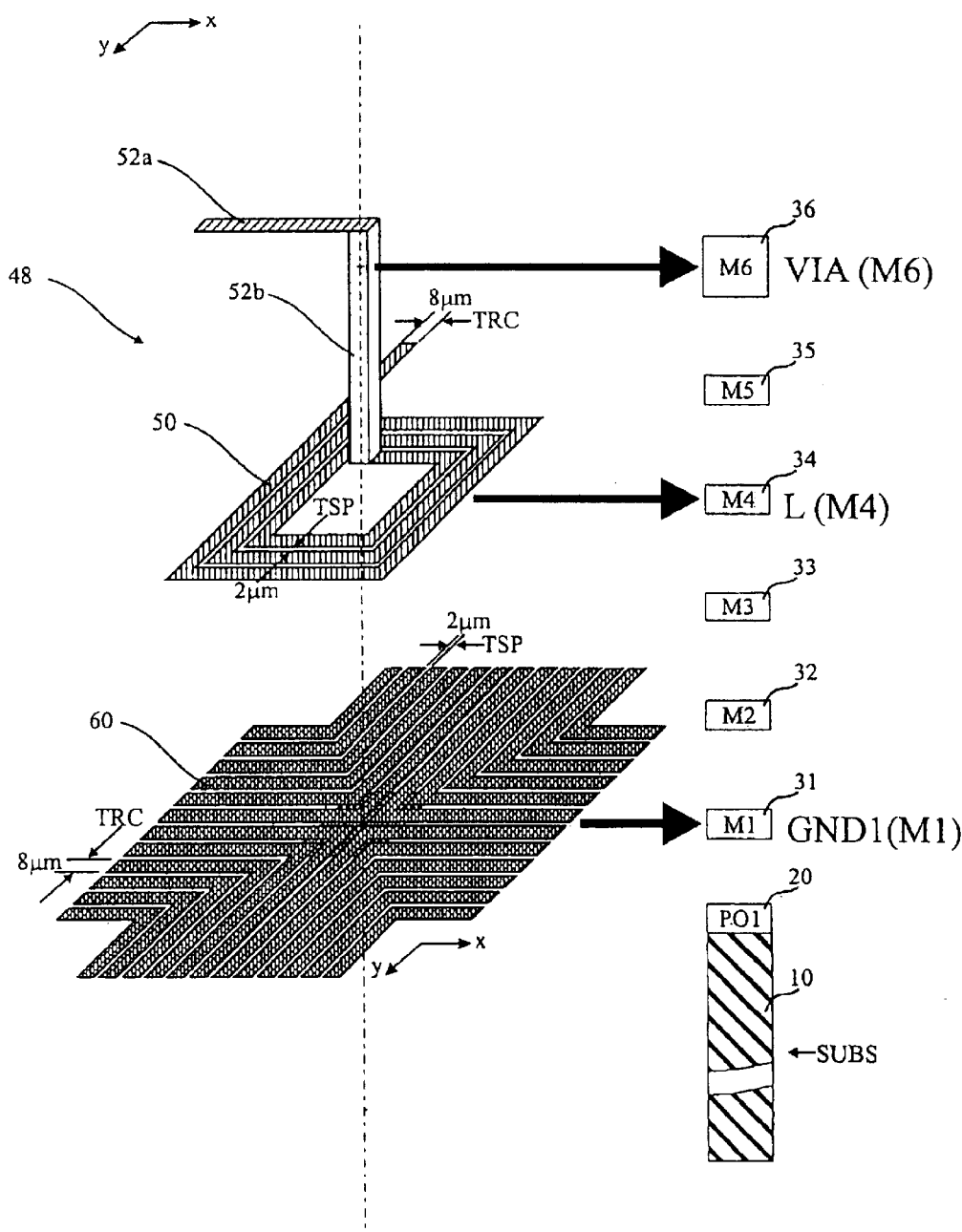

Fig. 3A CASE-A
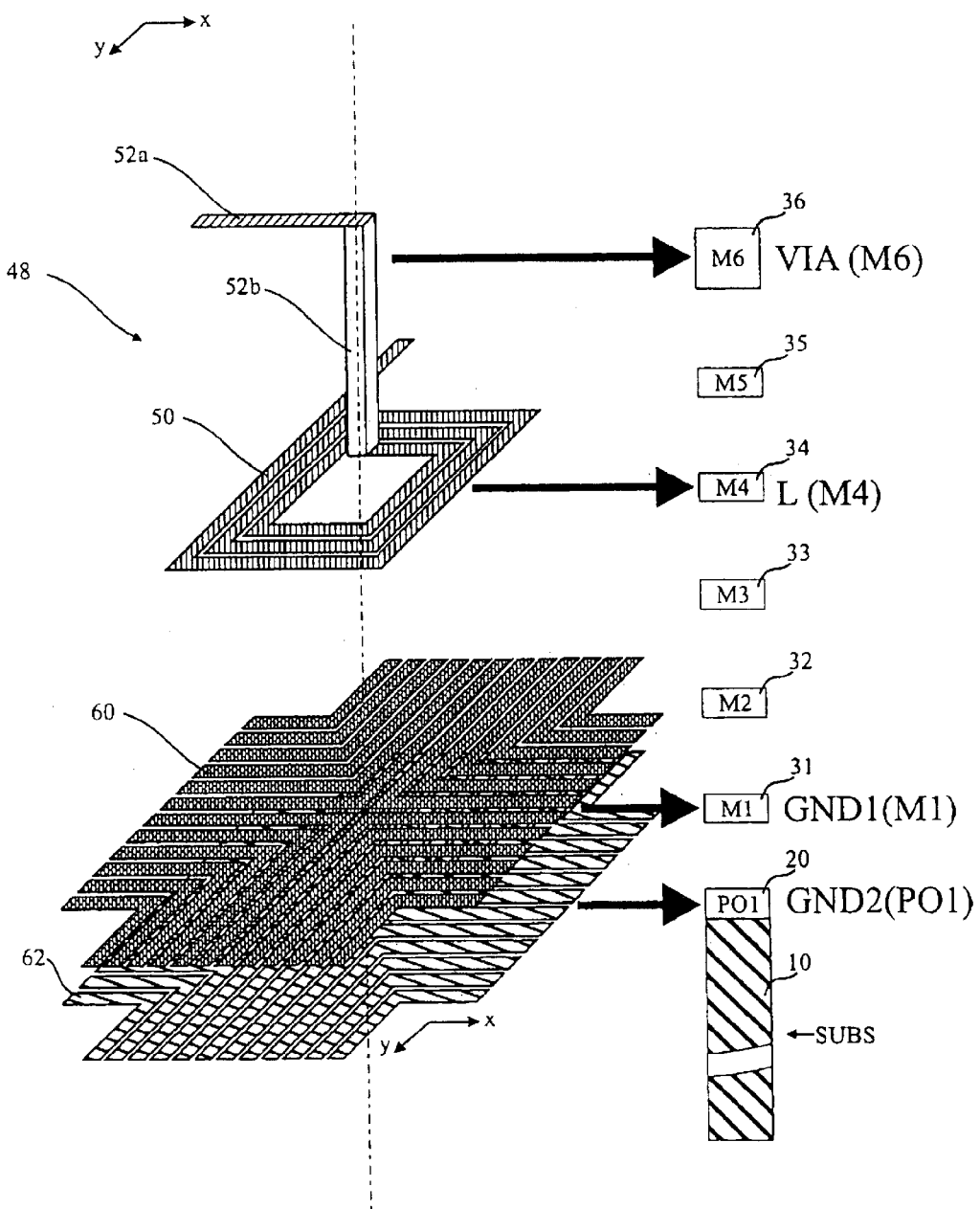

Fig. 4A CASE-B
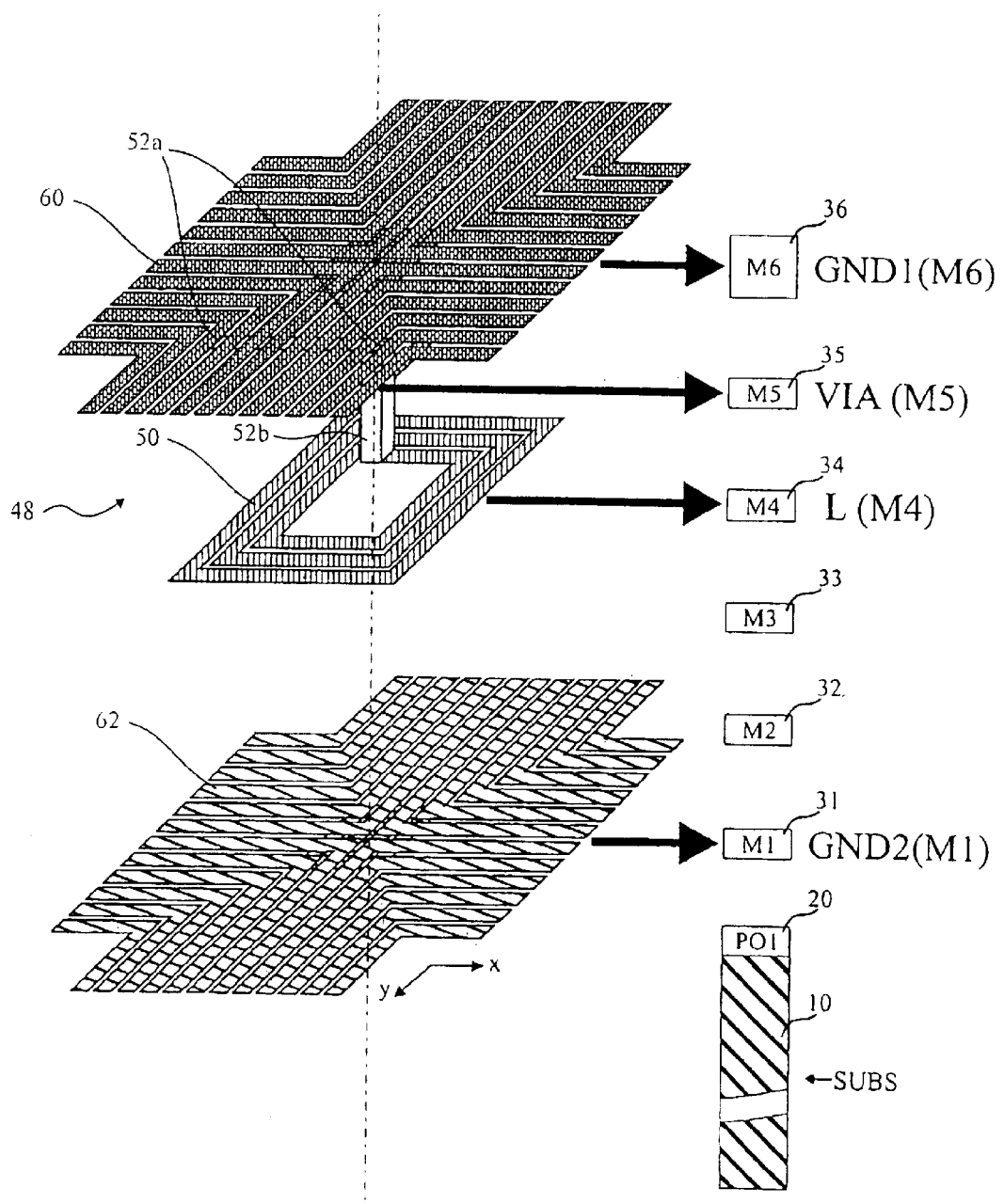

Fig. 5A CASE-C
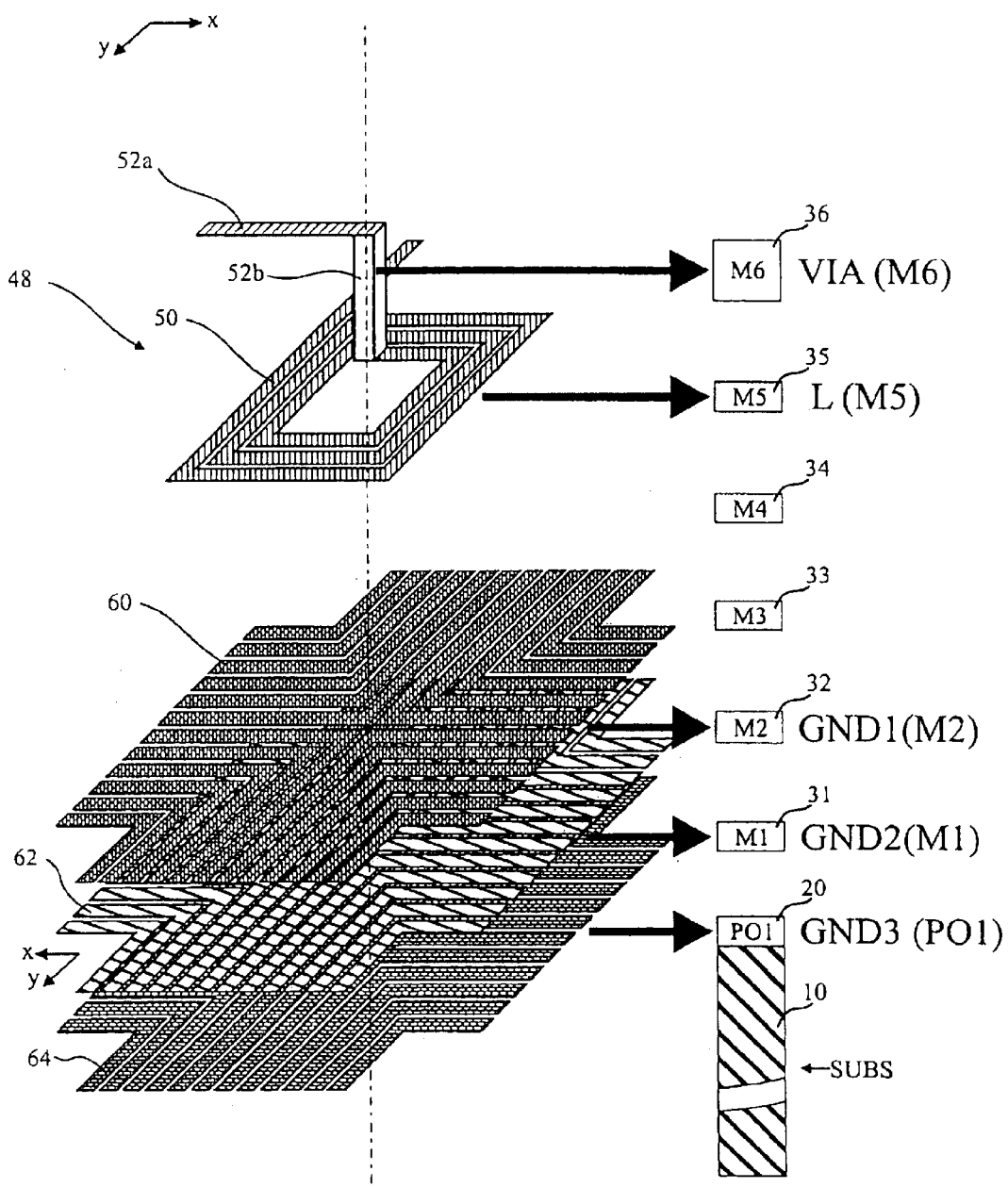

Fig. 6A CASE-D
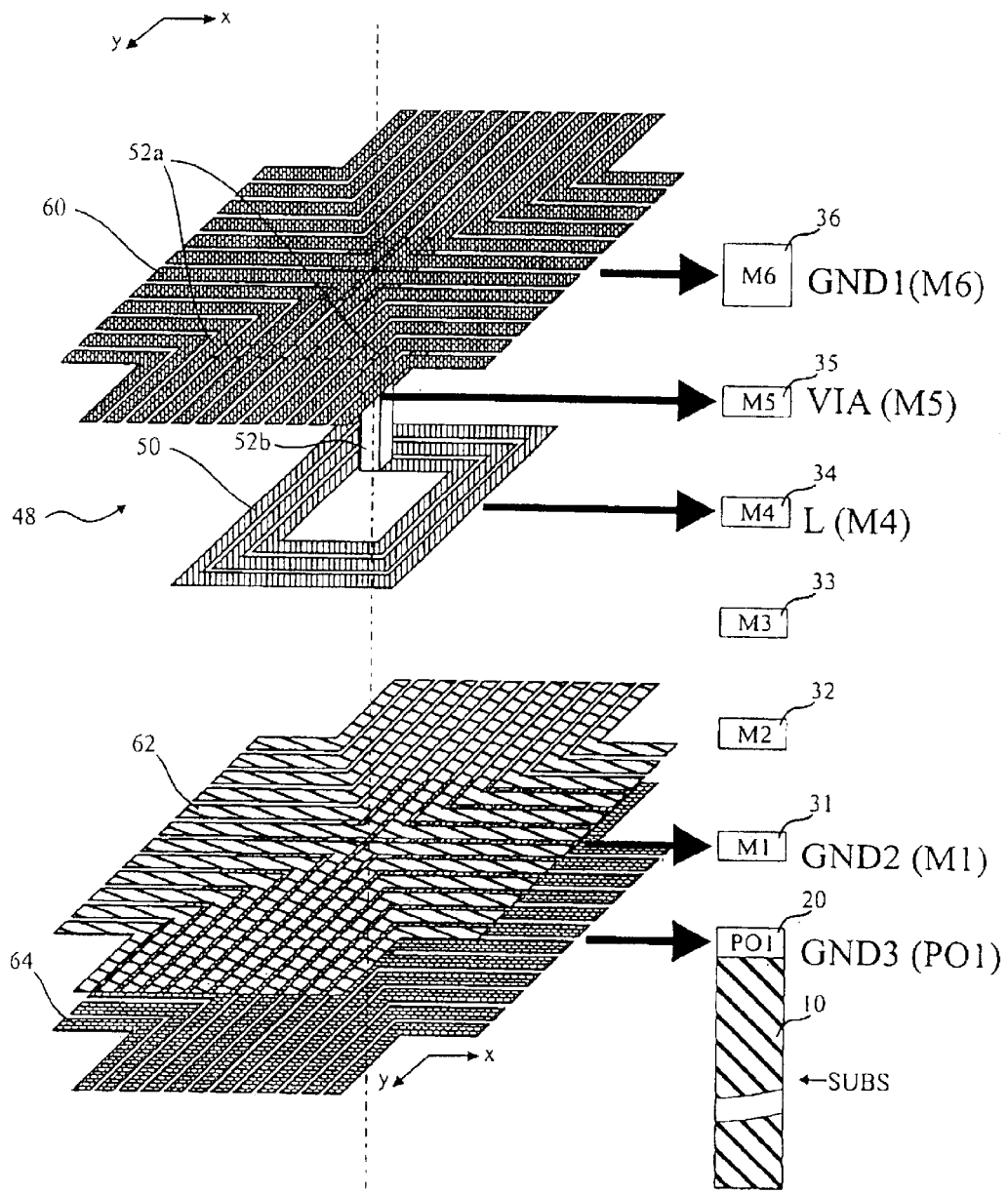

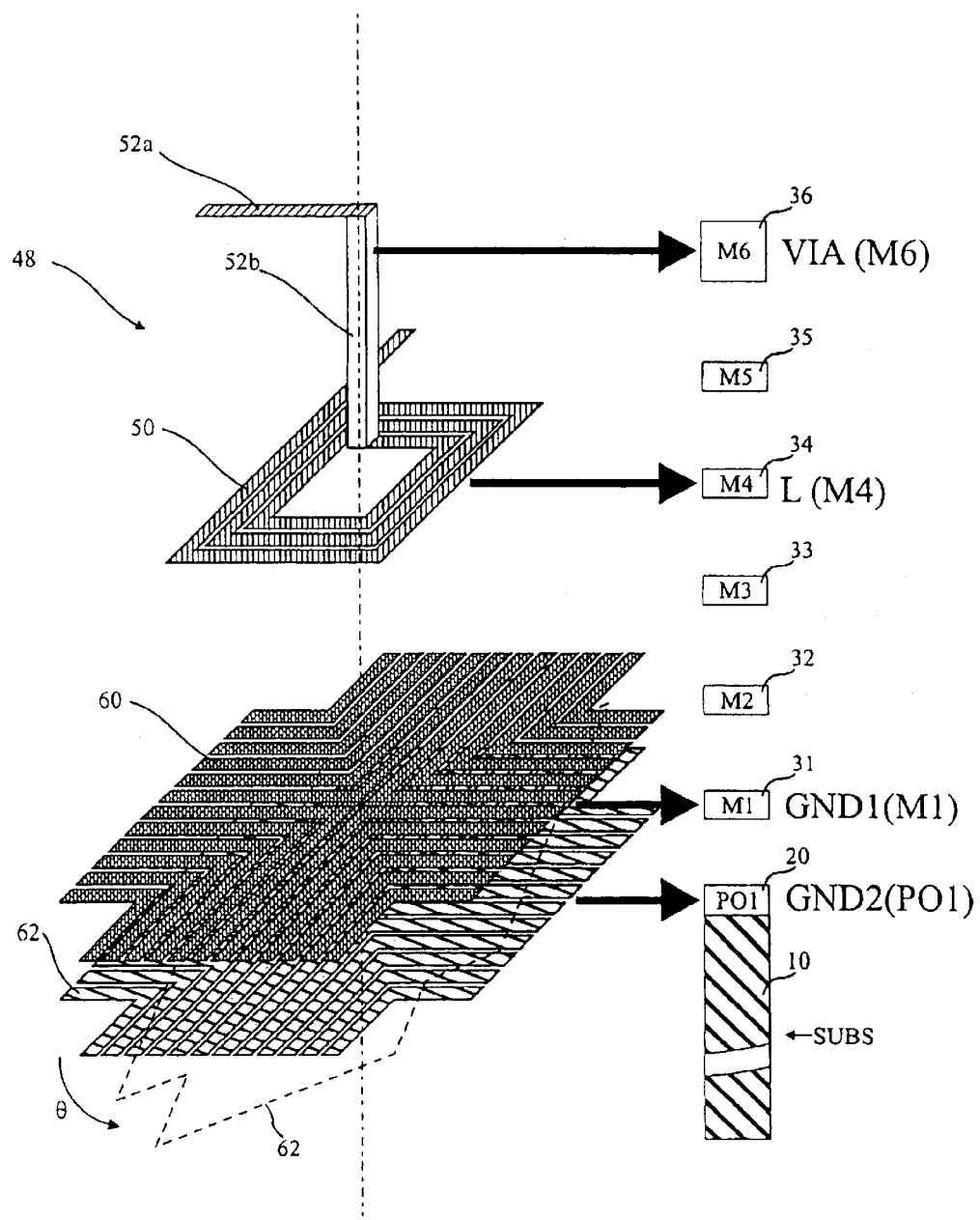
Fig. 7A CASE-A with Rotation

CASE-A Rotation
x-Offset = 0, y-Offset = 0

CASE-A Rotation
x-Offset = 0, y-Offset = 0

ACCURATE MULTI-GROUND INDUCTORS FOR HIGH-SPEED INTEGRATED CIRCUITS

FIELD OF THE INVENTION

The present invention relates generally to the field of data communication. More particularity, the present invention discloses a structure and a corresponding method of implementing an inductive component of accurate inductance value for optical communication circuits operating with an input clock speed of a few to 100 GHz/Sec where an accurate inductance value is often required to achieve a correspondingly accurate operating frequency. Thus, the present invention can be included into many circuits for the implementation of subsystem functions such as counters, timers, frequency multipliers and Phase Locked Loop (PLL) in an optical switch IC (Integrated Circuit) for optical communication. Additional related applications are: Optical communication at 2.48 Gbit/sec (OC48) and 40 Gbit/sec (OC768) data rate, Gigabit Ethernet, 10 Gigabit Ethernet, Blue Tooth technology (2.4 GHz) and wireless LAN (5.2 GHz). At such a high data rate, the hardware infrastructure for a multimedia information super highway is also enabled.

BACKGROUND OF THE INVENTION

Optical Fiber has been used in voice and data communication for some time now due to its high bandwidth and excellent signal quality resulting from its immunity to electromagnetic interference. The inherent optical data rate from a modulated single-mode laser beam travelling through an optical fiber is expected to well exceed 1000 Gbit/sec.

To keep up with the data rate of optical data communications, the associated signal processing IC (Integrated Circuit) need to operate in the multiple GHz (Gegahertz, 1 Gegahertz=$10^9$ cycles/sec) to hundreds of GHz range of clock frequency. To improve the performance parameters of such high speed circuits, the inclusion of inductive components properly designed for RF (Radio Frequency) operation, another type of stored-energy device in addition to the capacitive component, has become increasingly popular. For example, Yue et al described one type of on-chip spiral inductor with patterned ground shields for Si-Based RF IC's operating in a frequency range of 1–2 GHz. Here, a single ground plane was employed between a spiral inductor and Silicon substrate to increase the inductor Q (quality factor). Furthermore, the ground plane was patterned in a multiple-finger like structure with slots orthogonal to the inductor spiral to minimize an induced eddy current herein thus associated RF power loss (On-Chip Spiral Inductors with Patterned Ground Shields for Si-Based RF IC's, C. Patrick Yue et al, IEEE Journal of Solid-State Circuits, Vol. 33, NO. 5, May 1998). For another example, Zhou et al described monolithic transformers and their application in a differential CMOS RF low-noise amplifier where each of the monolithic transformers was implemented as a set of two coplanar, interwound spirals (Monolithic Transformers and Their Application in a Differential CMOS RF Low-Noise Amplifier, Jianjun J. Zhou et al, IEEE Journal of Solid-State Circuits, Vol. 33, NO. 12, December 1998). In U.S. Pat. No. 6,188,295 B1 dated Feb. 13, 2001, Tsai disclosed a multi-layered circuit with a top circuit interconnection layer and a lower patterned inductor layer sandwiched between two ground layers both located below the top circuit interconnection layer. By cutting through or partially notching certain micro-strips of the top circuit interconnection layer either the associated equivalent circuit capacitance is adjusted accordingly or a serially coupled inductance-capacitance circuit is formed. Regardless of these references, however, where a precise inductance value is required of the monolithic inductor for an application, for example an oscillator circuit having a precisely specified output frequency that is controlled by the monolithic inductor, there is a need of a simple systematic method whereby the monolithic inductor can be quickly implemented with low cost of development.

SUMMARY

The present invention is directed to a new design and method of implementing an inductive component within a high frequency integrated circuit having a structure of multiple conductive layers.

The first objective of this invention is for the inductive component to achieve an accurate, pre-determined inductance value.

A second objective of this invention is for the method of implementation of the inductive component to be simple, systematic, quick and low cost.

A third objective of this invention is for the method of implementation of the inductive component to be extendable to the implementation of a precision transformer component.

Other objectives, together with the foregoing are attained in the exercise of the invention in the following description and resulting in the embodiment illustrated in the accompanying drawings.

BRIEF DESCRIPTION OF DRAWINGS

The current invention will be better understood and the nature of the objectives set forth above will become apparent when consideration is given to the following detailed description of the preferred embodiments. For clarity of explanation, the detailed description further makes reference to the attached drawings herein:

FIG. 2A is a perspective illustration of a reference design of an inductive component wherein only one ground layer, with linear offset, is employed with an inductive layer to form the inductive component;

FIG. 3A is a perspective illustration of a first variation of the present invention design of an inductive component wherein two ground layers with linear offset, both located on the same side of an inductive layer, are employed with the inductive layer to form the inductive component;

FIG. 4A is a perspective illustration of a second variation of the present invention design of an inductive component wherein two ground layers with linear offset, each located on a different side of an inductive layer, are employed with the inductive layer to form the inductive component;

FIG. 5A is a perspective illustration of a third variation of the present invention design of an inductive component wherein three ground layers with linear offset, all located on the same side of an inductive layer, are employed with the inductive layer to form the inductive component;

FIG. 6A is a perspective illustration of a fourth variation of the present invention design of an inductive component wherein three ground layers with linear offset, surrounding an inductive layer, are employed with the inductive layer to form the inductive component;

FIG. 7A is a perspective illustration of a fifth variation of the present invention design of an inductive component wherein two ground layers with rotational offset, both located on the same side of an inductive layer, are employed with the inductive layer to form the inductive component.

DETAILED DESCRIPTION OF THE PREFERRED EMBODIMENTS

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessary obscuring aspects of the present invention.

Reference herein to "one embodiment" or an "embodiment" means that a particular feature, structure, or characteristics described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1:
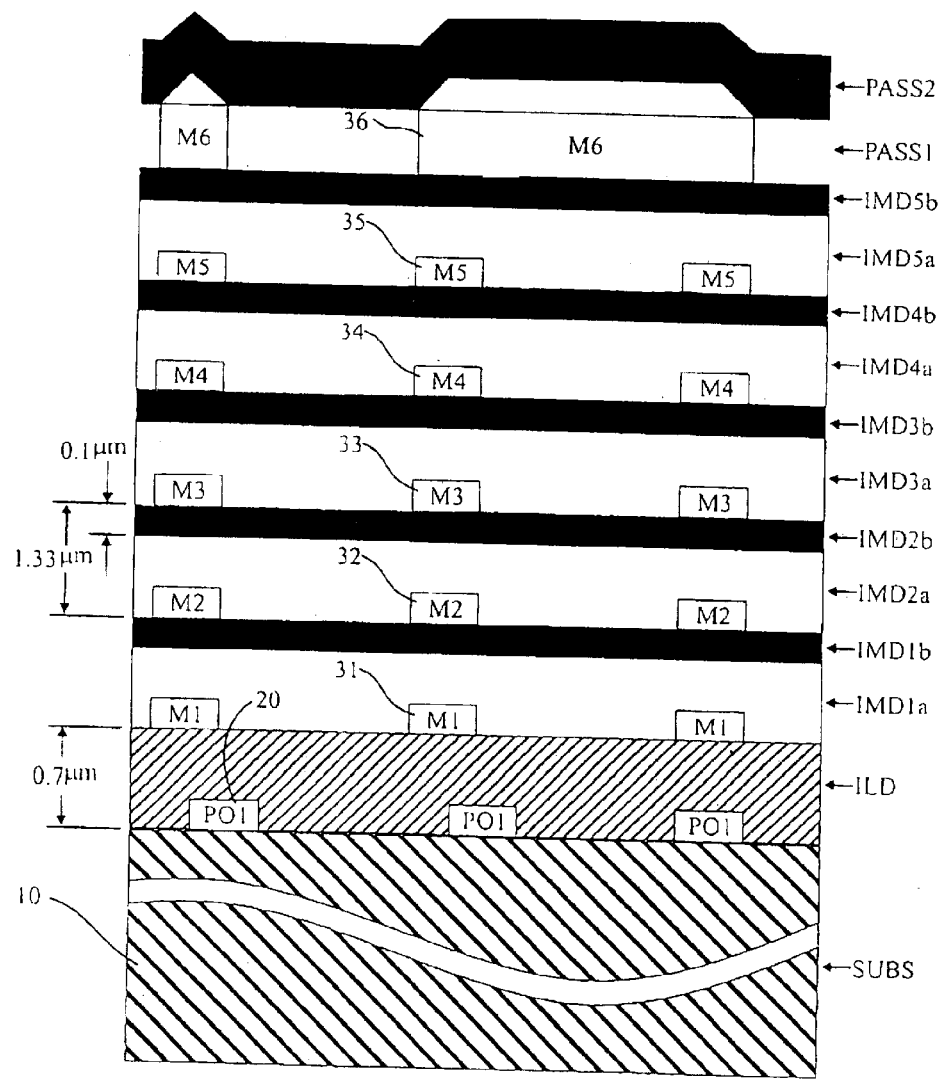
FIG. 1 illustrates the cross section of an integrated circuit having a structure of multiple conductive layers.

FIG. 1 illustrates a cross section of an integrated circuit having an IC substrate SUBS 10 located beneath a structure of multiple conductive layers such as a Polysilicon conductive layer 20, a metal-1 M1 31, a metal-2 M2 32, a metal-3 M3 33, a metal-4 M4 34, a metal-5 M5 35 and a metal-6 M6 36. Typically, an TC, although not shown herein for simplicity, is built in near the top of the IC substrate SUBS 10. The various conductive layers are insulated from each other with a corresponding number of dielectric layers. For example, the Polysilicon conductive layer 20 is insulated from the metal-1 M1 31 with a dielectric layer ILD of thickness 0.7 $\mu$m ($10^6$ meter), the metal-1 M1 31 is insulated from the metal-2 M2 32 with a dielectric layer IMD1a plus IMD1b and the metal-2 M2 32 is insulated from the metal-3 M3 33 with a dielectric layer IMD2a plus TMD2b (0.1 $\mu$m thick), etc. Finally, the metal-6 M6 36 is isolated from others with a dielectric layer PASS 1 plus a top dielectric layer PASS2. The corresponding pitch between adjacent metal layers is 1.33 $\mu$m as illustrated. With the availability of multiple conductive layers, in this case seven (7) including the Polysilicon conductive layer 20, an inductive component, operating with an IC located on the IC substrate SUBS 10, can be implemented in many ways and those will be presently illustrated.

Figure 2B:
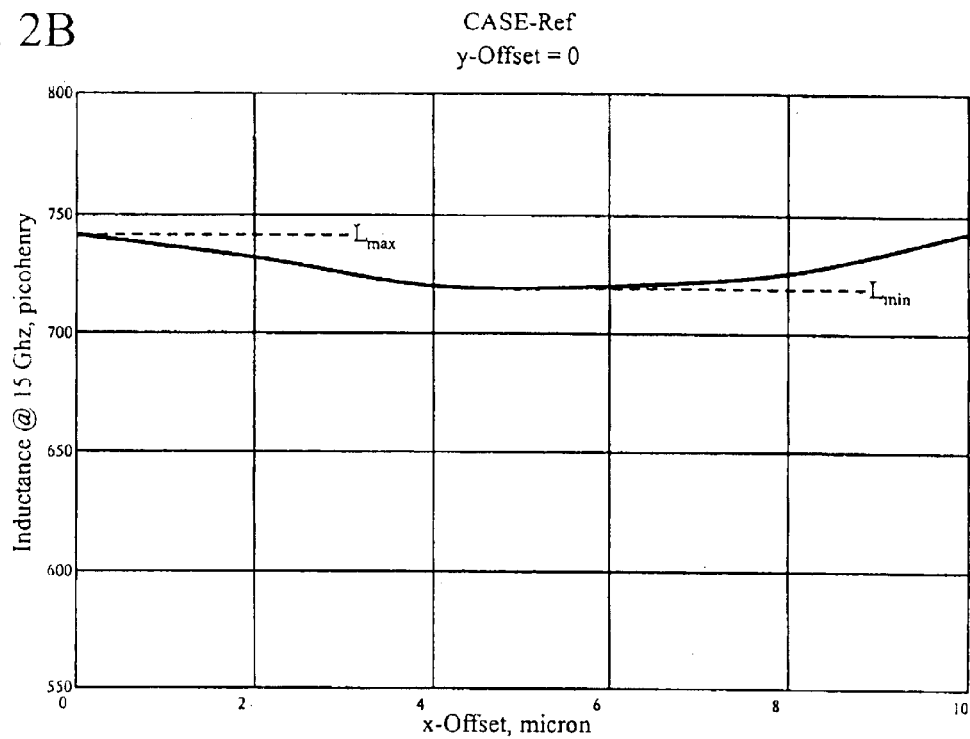
FIG. 2B and FIG. 2C are the inductance and return loss characteristics for the design of FIG. 2A.

FIG. 2A is a perspective illustration of a reference design, called CASE-Ref, commonly used in the art, of an inductive component comprising a spiral inductive coil 48 and a single first ground layer 60. The spiral inductive coil 48 further comprises an inductive layer 50 shaped into a spiral-like geometry, a feed-through via 52b and a cross-over layer 52a. Furthermore, the first ground layer 60 is illustrated to be patterned into a multiple-finger like structure with slots orthogonal to the spiral inductive coil 48 to minimize an induced eddy current herein thus associated RF (Radio Frequency) power loss. It is remarked that, to minimize the induced loop current, the first ground layer 60 can be patterned into a variety of other geometries, for example a Swiss-cheese geometry with a plurality of embedded holes should work as well. Also, an cuter frame shorting all the fingers of the first ground layer 60 together is not shown here to avoid unnecessary obscuring details. Furthermore, for simplicity of illustration from now on, in all cases of design of the inductive component a trace TRC of width 8 m and a trace spacing TSP of 2 m will be used. As illustrated with three thick right-pointing arrows, in this case the inductive layer 50 is implemented with metal-4 M4 34, the cross-over layer 52a is implemented with the metal-6 M6 36 and the first ground layer 60 is implanted with the metal-1 M1 31. To simply and systematically adjust the inductance value of the inductive component, the present invention proposes that, in this ease, tho first ground layer 60 to be linearly offset, with respect to the spiral inductive coil 48, in a plane parallel to the plane of the inductive layer 50. This is illustrated with an x-axis and a yaxis located next to the first ground layer 60. The corresponding change in inductance at a fixed frequency of 15 GHz, as a function of x-offset, with a y-offset =0, is illustrated in FIG. 2B.

Figure 2C:
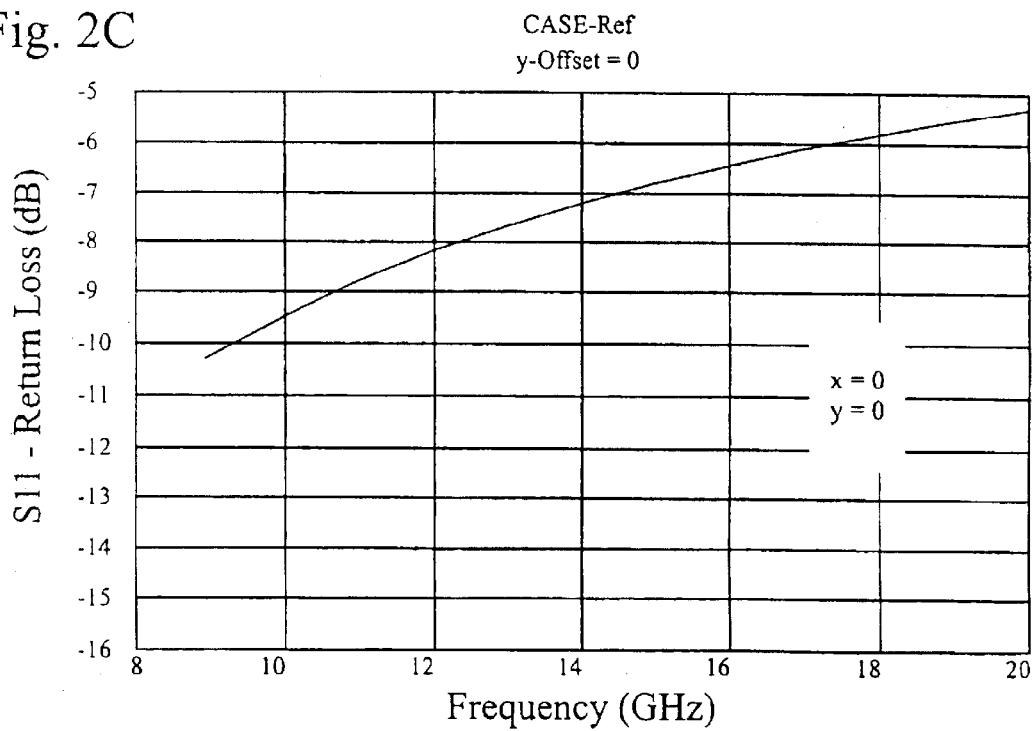

FIG. 2B shows that, while a smooth functional characteristics does happen, the corresponding total range of inductance change is very small. That is, a Relative Inductance Range (RIR) of only $$RIR=(L_{max}-L_{min})/L_{max}=2.8\%$$

is generated and this is not very useful for practical design applications. Another important parameter of the inductive component under such a high operating frequency is called return loss, or symbolically $S_{11}$. The return loss $S_{11}$ is well known in the art and, for example, was defined by Hayward (Introduction to Radio Frequency Design, Wes Hayward, W7ZOI, Chapter 4, P. 116–P. 120). To be a useful inductive component, its return loss $S_{11}$ vs. frequency characteristics around an operating center frequency must be a smooth, monotonic curve. Furthermore, at the center frequency, the higher the absolute magnitude of the return loss $S_{11}$ the better. Thus, FIG. 2C, the return loss characteristics for the reference design of FIG. 2A at offset x=0 and y=0, does exhibit an acceptable return loss $S_{11}$ characteristics of an absolute magnitude equal to 6.8 dB (deciBel) at 15 GHz.

Figure 3B:
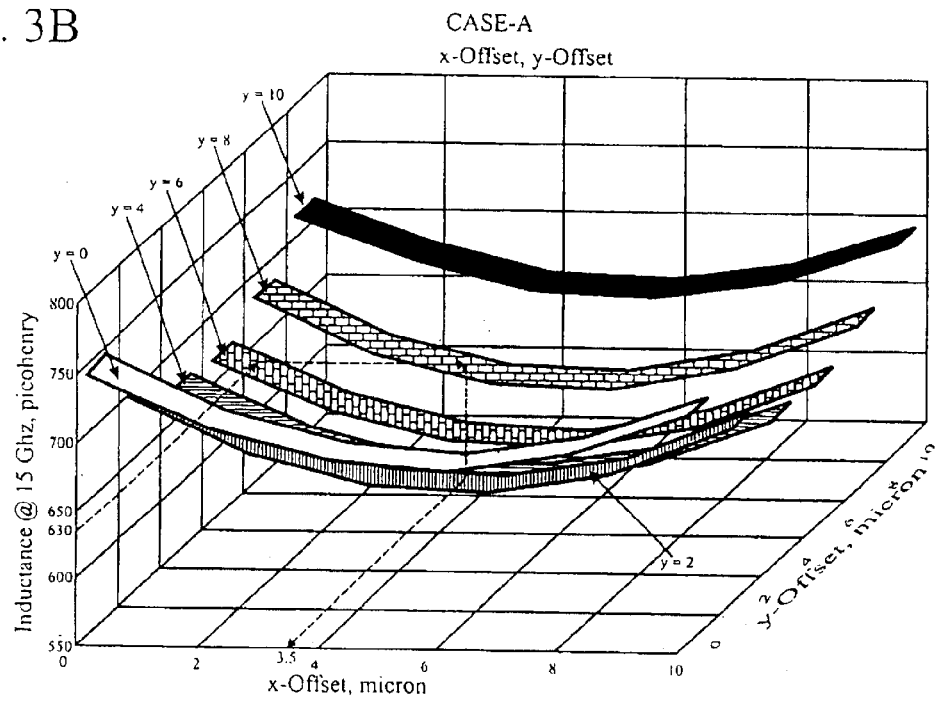
FIG. 3B and FIG. 3C are the inductance and return loss characteristics for the design of FIG. 3A.

FIG. 3A is a perspective illustration of a first variation, called CASE-A, of the present invention design of an inductive component comprising a spiral inductive coil 48 and two ground layers designated a first ground layer 60 and a second ground layer 62. The two ground layers are both located on the same side of the spiral inductive coil 48. Like before, the spiral inductive coil 48 further comprises an inductive layer 50 shaped into a spiral-like geometry, a feed-through via 52b and a cross-over layer 52a. Also, the first ground layer 60 and the second ground layer 62 are patterned the same way, being a multiple-finger like structure with slots orthogonal to the spiral inductive coil 48 to minimize an induced loop current herein thus associated RF power loss. As illustrated with four thick right-pointing arrows, now the inductive layer 50 is implemented with metal-4 M4 34, the cross-over layer 52a is implemented with the metal-6 M6 36, the first ground layer 60 is implemented with the metal-1 M1 31 and the second ground layer 62 is implemented with the Polysilicon conductive layer 20. Like before, to simply and systematically adjust the inductance value of the inductive component, the present invention proposes that, for CASE-A, the second ground layer 62 to be linearly offset, with respect to the spiral inductive coil 48, in a plane parallel to the plane of the inductive layer 50. This is illustrated with an x-axis and a y-axis located next to the second ground layer 62. The corresponding change in inductance at a fixed frequency of 15 GHz, as a function of both an x-offset and a y-offset, is illustrated in FIG. 3B in the form of a three dimensional perspective plot of piece-wise linearized data.

FIG. 3B shows that, in addition to being a family of smooth functional characteristics, a corresponding RIR of around 8.5% that is significantly higher than CASE-Ref (2.8%) is generated and this should be useful for practical design applications. For example, a case where an inductance value of 630 picohenry is needed can be satisfied with, following the direction of a set of four dashed arrows, an offset combination of x=3.5 m and y=8 m. In the mask design phase of the inductive component the task of generating a set of identical ground planes with a systematically increasing amount of x- and y-offsets is quite easy with an expected design time of only about a half day. However, if one were to generate a set of gradually changing spiral geometry of the inductive layer 50 to result in a systematically changing inductance value the mask design phase would be quite tedious and it could take about a week. Additionally, the cost of making a complete mask set for an IC of 0.18 m geometry nowadays is around $300,000 and the subsequent IC processing of the mask set will take about 50 days. However, the cost of making only a mask change for a single conductive layer is only about $2,000 and the subsequent IC processing of the single conductive layer will only take a few days. Therefore, with the technique of the present invention a desired inductance value for the inductive component can be accurately realized with a small amount of time and cost for designing and implementation.

Figure 3C:
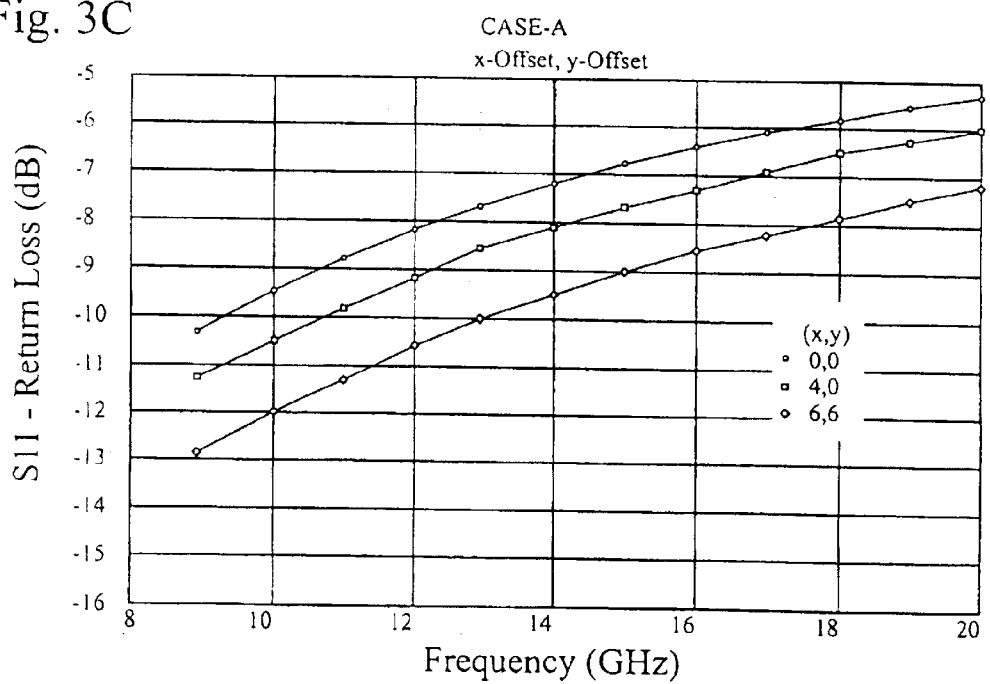

FIG. 3C shows the return loss $S_{11}$ for CASE-A at various offsets of the second ground layer 62. The return loss $S_{11}$ characteristics are all acceptable with an absolute magnitude around 8 dB at 15 GHz that is significantly better than CASE-Ref (6.8 dB). Additionally, comparing with CASE-Ref, the employment of two ground planes, having an offset between them, between the spiral inductive coil 48 and the IC substrate SUBS 10 is expected to provide an additional advantage of higher level of shielding of radio frequency emission between the inductive component and an IC located on the IC substrate SUBS 10.

Figure 4B:
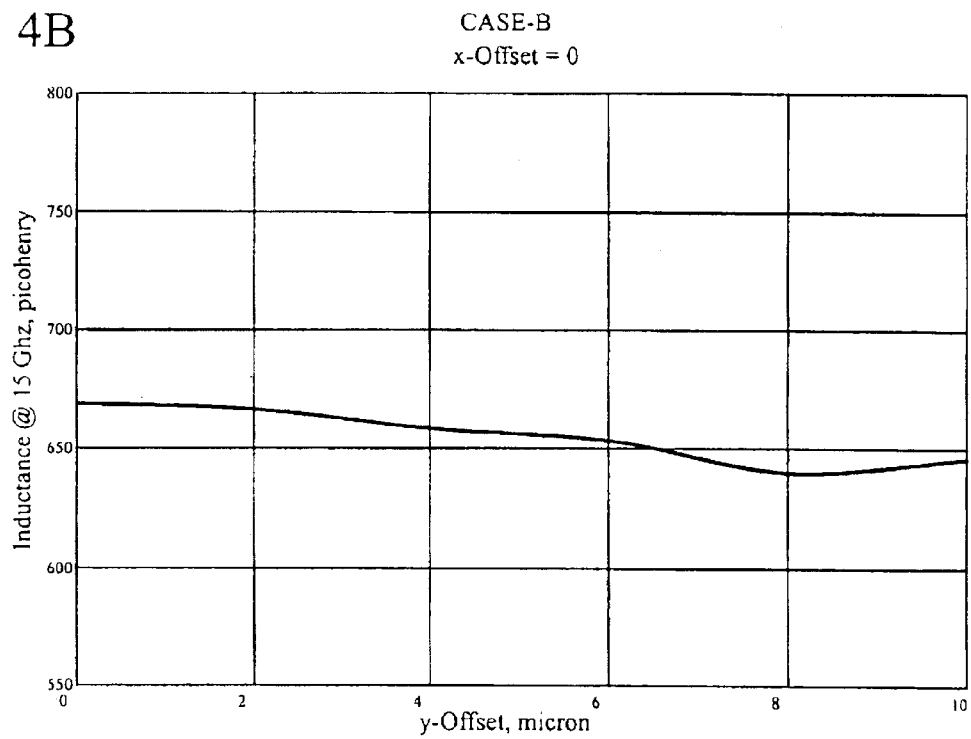
FIG. 4B and FIG. 4C are the inductance and return loss characteristics for the design of FIG. 4A.

FIG. 4A is a perspective illustration of a second variation, called CASE-B, of the present invention design of an inductive component comprising a spiral inductive coil 48 and two ground layers designated a first ground layer 60 and a second ground layer 62. However, the two ground layers are now located on different sides of the spiral inductive coil 48. As illustrated with four thick right-pointing arrows, the inductive layer 50 is implemented with the metal-4 M4 34, the cross-over layer 52a is implemented with the metal-5 M5 35, the first ground layer 60 is implemented with the metal-6 M6 36 and the second ground layer 62 is implemented with the metal-1 M1 31. Here, the present invention proposes that the second ground layer 62 to be linearly offset with respect to the spiral inductive coil 48. This is again illustrated with an x-axis and a y-axis located next to the second ground layer 62. The corresponding change in inductance with an x-offset=0 at a fixed frequency of 15 GHz, as a function of a y-offset, is illustrated in FIG. 4B.

FIG. 4B shows that an RIR of about 4.3% is generated, while still being better than that of CASE-Ref (2.8%), that is only marginally useful for practical design applications.

Figure 4C:
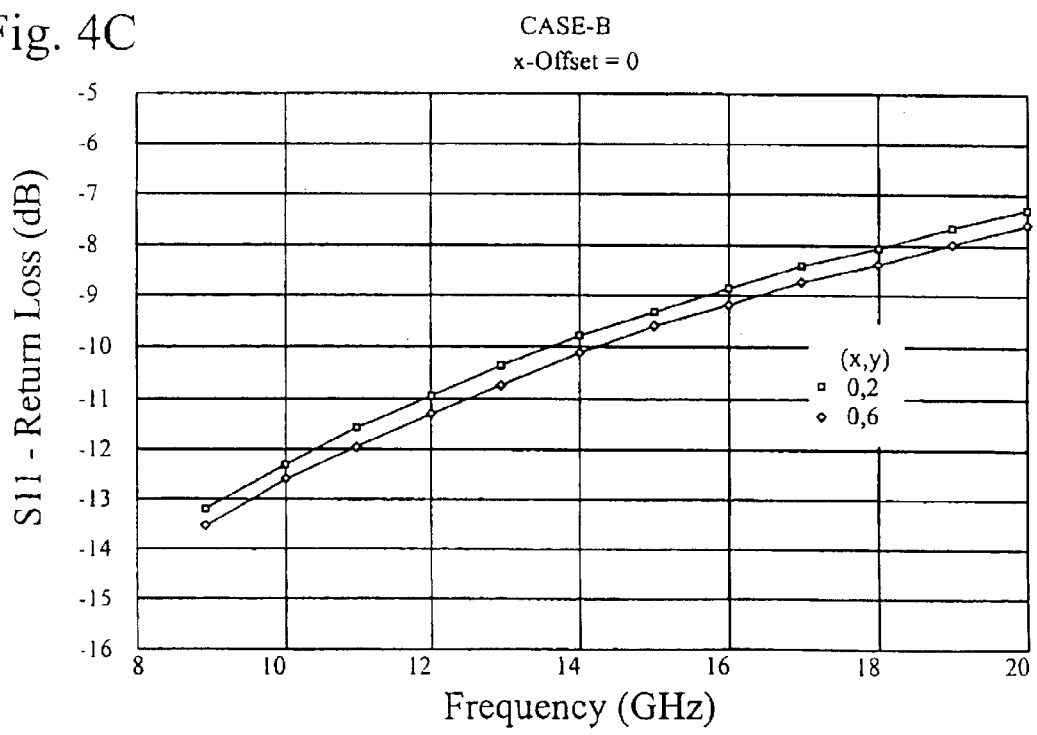

FIG. 4C shows the return loss $S_{11}$ for CASE-B at various offsets of the second ground layer 62. The return loss $S_{11}$ characteristics has an absolute magnitude around 9.5 dB at 15 GHz that is significantly better than CASE-Ref (6.8 dB). Additionally, comparing with CASE-Ref, the employment of a first ground layer 60 above the spiral inductive coil 48 is expected to provide an additional advantage of a higher level of shielding of radio frequency emission from the inductive component into a surrounding ambient. This advantage of the present invention can become especially important in an application packaging environment called flip-chip wherein the IC comprising the inductive component is flipped upside down and bonded in intimate contact with other underlying RF radiating electronic circuits.

Figure 5B:
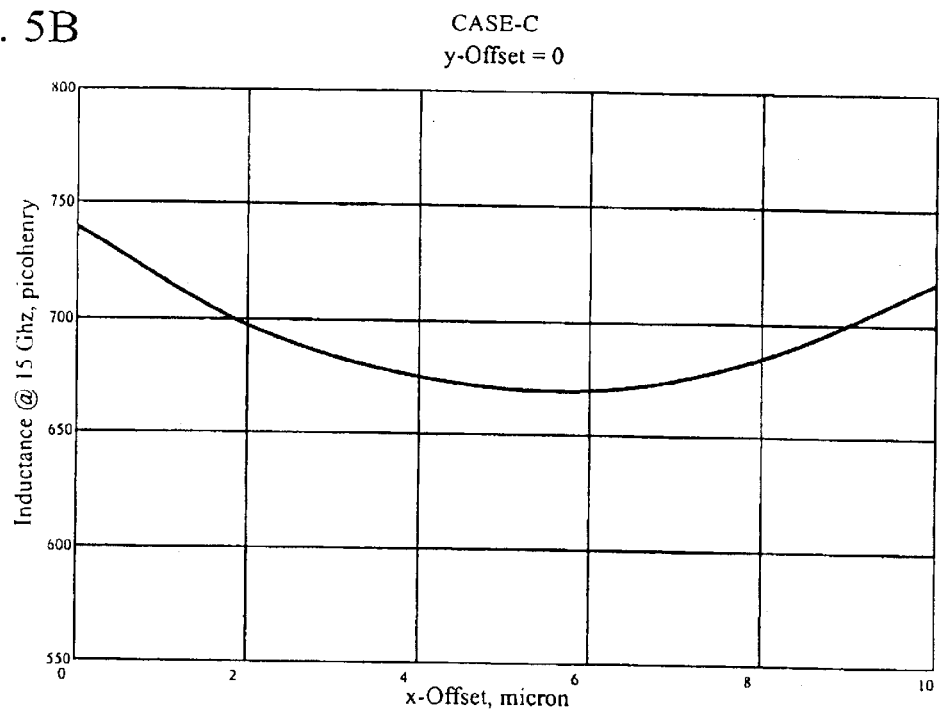
FIG. 5B and FIG. 5C are the inductance and return loss characteristics for the design of FIG. 5A.

FIG. 5A is a perspective illustration of a third variation, called CASE-C, of the present invention design of an inductive component comprising a spiral inductive coil 48 and three ground layers designated a first ground layer 60, a second ground layer 62 and a third ground layer 64. All three ground layers are located on the same side of the spiral inductive coil 48, between the spiral inductive coil 48 and the IC substrate SUBS 10. Here, the present invention proposes that the second ground layer 62 to be linearly offset with respect to the spiral inductive coil 48. The corresponding change in inductance with a y-offset=0 at a fixed frequency of 15 GHz, as a function of an x-offset, is illustrated in FIG. 5B.

FIG. 5B shows that an RIR of about 9.6% is generated, being significantly better than that of CASE-Ref (2.8%), that is useful for practical design applications.

Figure 5C:
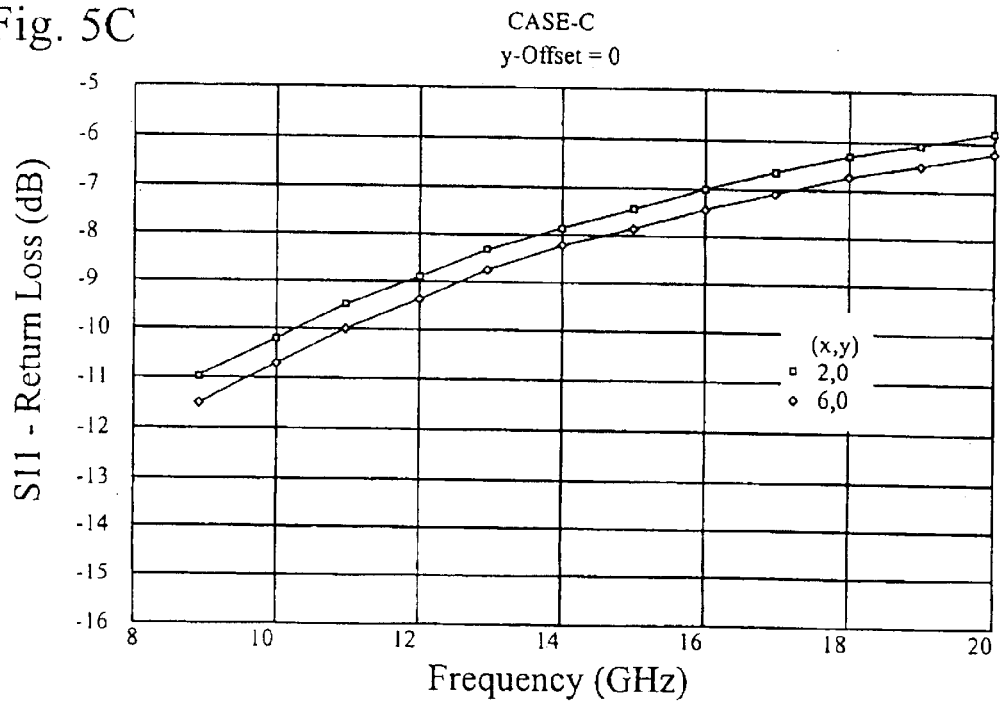

FIG. 5C shows the return loss $S_{11}$ for CASE-C at various offsets of the second ground layer 62. The return loss $S_{11}$ characteristics has an absolute magnitude around 7.7 dB at 15 GHz that is better than CASE-A (6.8 dB). Additionally, comparing with CASE-Ref, the employment of three ground planes, having an offset between them, between the spiral inductive coil 48 and the IC substrate SUBS 10 is expected to provide a much higher level of shielding of radio frequency emission between the inductive component and an IC located on the IC substrate SUBS 10.

Figure 6B:
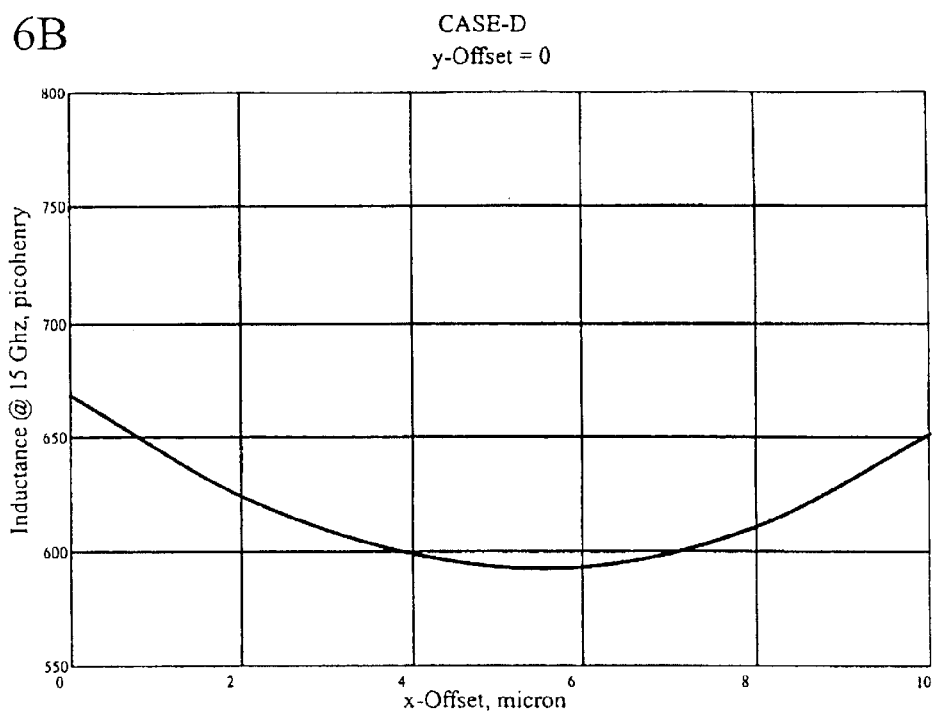
FIG. 6B and FIG. 6C are the inductance and return loss characteristics for the design of FIG. 6A.

FIG. 6A is a perspective illustration of a fourth variation, called CASE-D, of the present invention design of an inductive component comprising a spiral inductive coil 48 and three ground layers designated a first ground layer 60, a second ground layer 62 and a third ground layer 64. The first ground layer 60 is located above the spiral inductive coil 48 while the other two ground layers 62 and 64 are located below the spiral inductive coil 48 but above the IC substrate SUBS 10. Here, the present invention proposes that the third ground layer 64 to be linearly offset with respect to the spiral inductive coil 48. The corresponding change in inductance with a y-offset=0 at a fixed frequency of 15 GHz, as a function of an x-offset, is illustrated in FIG. 6B.

FIG. 6B shows that an RIR of about 11.2% is generated, being substantially better than that of CASE-Ref (2.8%), that is quite useful for practical design applications.

Figure 6C:
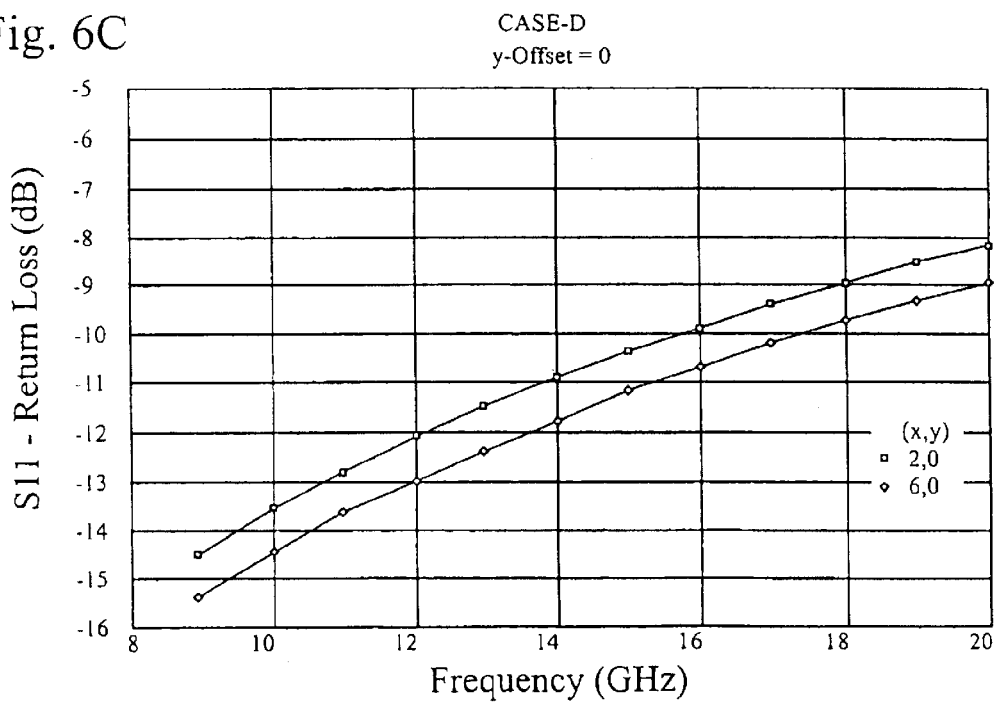

FIG. 6C shows the return loss $S_{11}$ for CASE-D at various offsets of the third ground layer 64. The return loss $S_{11}$ characteristics has an absolute magnitude around 10.7 dB at 15 GHz that is significantly better than CASE-A (6.8 dB). Additionally, this arrangement of the ground planes is expected to provide both a higher level of shielding of radio frequency emission between the inductive component and an IC located on the IC substrate SUBS 10 and a higher level of shielding of radio frequency emission from the inductive component into a surrounding ambient. As remarked before under FIG. 4C, this advantage of the present invention can become especially important in an application packaging environment called flip-chip wherein the IC comprising the inductive component is flipped upside down and bonded in intimate contact with other underlying RF radiating electronic circuits.

Figure 7B:
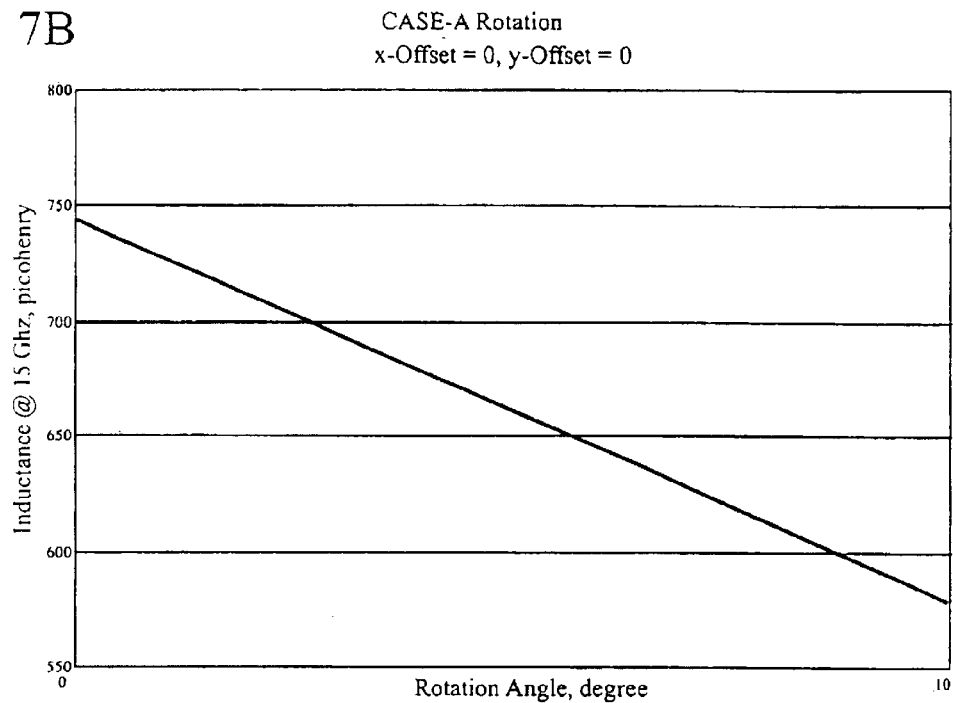
FIG. 7B and FIG. 7C are the inductance and return loss characteristics for the design of FIG. 7A.

FIG. 7A is a perspective illustration of a fifth variation, called CASE-A with Rotation, of the present invention design of an inductive component that is identical to CASE-A of FIG. 3A except that the second ground layer 62 is now to be rotationally offset by an angle □ with respect to the spiral inductive coil 48. The corresponding change in inductance at a fixed frequency of 15 GHz, as a function of □, is illustrated in FIG. 7B.

FIG. 7B shows that an RIR of about 22% is generated, being much better than that of CASE-Ref (2.8%), that is very useful for practical design applications.

Figure 7C:
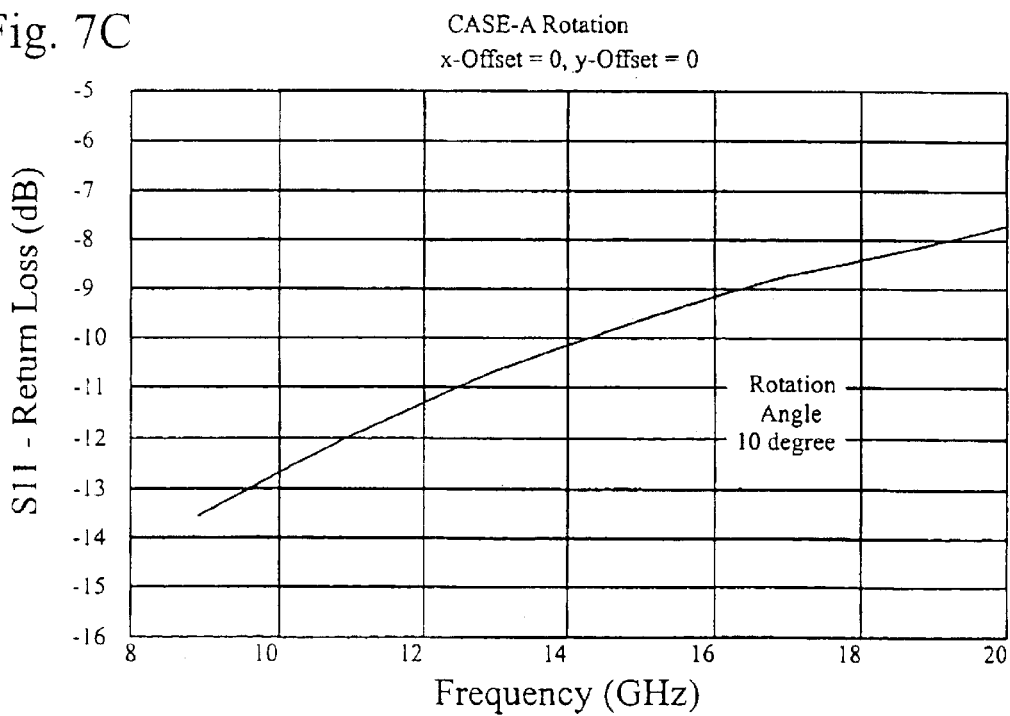

FIG. 7C shows the return loss $S_{11}$ for CASE-D at various offsets of the third ground layer 64. The return loss $S_{11}$ characteristics has an absolute magnitude around 9.6 dB at 15 GHz that is significantly better than CASE-A (6.8 dB). Additionally, this arrangement of the ground planes is expected to provide a higher level of shielding of radio frequency emission between the inductive component and an IC located on the IC substrate SUBS 10.

The following TABLE-1 summarizes the various advantages of the present invention with respect to the CASE-Ref:

TABLE-1

| | RIR (%) | return loss magnitude $S_{11}$(dB) | RF shielding inductor-IC | RF shielding inductor-ambient |
|---|---|---|---|---|
| CASE-Ref | 2.8 | 6.8 | reference | reference |
| CASE-A linear offset | 8.5 | 8 | higher | similar |
| CASE-B linear offset | 4.3 | 9.5 | similar | higher |
| CASE-C linear offset | 9.6 | 7.7 | much higher | similar |
| CASE-D linear offset | 11.2 | 10.7 | higher | higher |
| CASE-A Rotation | 22 | 9.6 | higher | similar |

The invention has been described using exemplary preferred embodiments. However, for those skilled in this field, the preferred embodiments can be easily adapted and modified to suit additional applications without departing from the spirit and scope of this invention. For example, it should be clear by now that the scope of the present invention is not limited to the illustrated geometry of the inductive component with a TRC of 8 m and a TSP of 2 m as long as these dimensions are consistent with the subsequent IC processing steps. For another example, for those skilled in the art, the structure and method to implement a precision inductive component as described herein can certainly be extended to a multi-spiral transformer having an accurate set of predetermined inductance values for its individual coils and an accurate set of predetermined coupling coefficients amongst its coils. Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

What is claimed are the following:

1. An inductive component for a high frequency integrated circuit, the inductive component comprising:

an inductive layer patterned into a spiral-like geometry; and a first ground layer patterned into a first geometry;

a second ground layer patterned into a second geometry, and including substantially arrays of holes, gaps, or slots in accordance with the second geometry;

a third ground layer patterned into the first geometry, the inductive layer disposed on top of the first ground layer, the second ground layer and the third ground layer, wherein a predetermined inductance value of the inductive component is achieved with relative movements among the inductive layer, the first ground layer, the second ground layer and the third ground layer.

2. The inductive component of claim 1, wherein the relative movements include a linearly relative movement between the inductive layer and the first ground layer.

3. The inductive component of claim 1, wherein the relative movements include a rotational movement between the inductive layer and the first ground layer.

4. The inductive component of claim 1, wherein the relative movements result In a significantly improved return loss of the inductive component.

5. The inductive component of claim 4, wherein the first ground layer introduces, a higher level of shielding of Radio Frequency (RF) emission from the inductive component.

6. The inductive component of claim 1, wherein the spiral-like geometry of the inductive layer and the first geometry of the first ground layer are so designed to minimize any induced current.

7. The inductive component of claim 6, wherein the induced current includes an eddy current and a loop current.

8. The inductive component of claim 6, wherein the inductive layer includes a conducting stripe wound in parallel into a flat spiral that has a shape in accordance with the spiral-like geometry, and the first geometry of the first ground layer is a structure with slots orthogonal to the conducting stripe.

9. The inductive component of claim 1, wherein the first ground layer includes substantially arrays of holes, gaps, or slots in accordance with the first geometry of the first ground layer.

10. The inductive component of claim 1, wherein the predetermined inductance value of the inductive component is achieved with relative movements among the inductive layer, the first ground layer and the second ground layer.

11. The inductive component of claim 1, wherein the inductive layer is disposed between the first ground layer and the second ground layer.

12. The inductive component of claim 1, wherein the third ground layer is disposed between the first ground layer and the second ground layer.

13. A method for forming an inductive component for a high frequency integrated circuit, the method comprising:

forming an inductive layer according to a spiral-like geometry;

forming a first ground layer according to a first geometry;

forming a second ground layer patterned into a second geometry, the second ground layer including substantially arrays of holes, gape, or slots in accordance with the second geometry;

forming a third ground layer patterned into the first geometry, the inductive layer disposed on top of the first ground layer, the second ground layer and the third ground layer; and wherein a predetermined inductance value of the inductive component is achieved with relative movements among the inductive layer, the first ground layer, the second around layer and the third ground layer.

14. The method of claim 13, wherein the relative movements include a linearly relative movement or a rotational movement between the inductive layer and the first ground layer.

15. The method of claim 13, wherein the relative movements result in a significantly improved return loss of the inductive component.

16. The method of claim 13, wherein the first ground layer introduces a higher level of shielding of Radio Frequency (RF) emission from the inductive component.

17. The method of claim 13, wherein the spiral-like geometry of the inductive layer and the first geometry of the first ground layer are so designed to minimize any induced current.

18. The method of claim 13, wherein the forming of the inductive layer includes winding a conducting stripe into a flat spiral that has a shape in accordance with the spiral-like geometry, and the first geometry of the first ground layer is a structure with slots orthogonal to the conducting stripe.

19. The method of claim 18, wherein the first ground layer includes substantially arrays of holes, gaps, or slots in accordance with the first geometry of the first ground layer.

20. The method of claim 13, wherein the predetermined inductance value of the inductive component is achieved with relative movements among the inductive layer, the first ground layer and the second ground layer.

21. The method of claim 13, wherein the inductive layer is disposed between the first ground layer and the second ground layer.

22. The method of claim 13, wherein the third ground layer is disposed between the first ground layer and the second ground layer.

* * * * *